United States Patent
Fujiwara et al.

(10) Patent No.: US 10,969,434 B2
(45) Date of Patent: Apr. 6, 2021

(54) METHODS AND APPARATUSES TO DETECT TEST PROBE CONTACT AT EXTERNAL TERMINALS

(71) Applicant: Micron Technology, Inc., Boise, ID (US)

(72) Inventors: Yoshinori Fujiwara, Boise, ID (US); Timothy M. O'Neil, Boise, ID (US); Tomio Okuda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 16/559,511

(22) Filed: Sep. 3, 2019

(65) Prior Publication Data

US 2021/0063487 A1    Mar. 4, 2021

(51) Int. Cl.
| | |
|---|---|
| *G01R 31/319* | (2006.01) |
| *G01R 31/28* | (2006.01) |
| *G01R 1/067* | (2006.01) |
| *G01R 31/317* | (2006.01) |
| *G06F 9/30* | (2018.01) |
| *G01R 31/3181* | (2006.01) |

(52) U.S. Cl.
CPC ... *G01R 31/31926* (2013.01); *G01R 1/06794* (2013.01); *G01R 31/2808* (2013.01); *G01R 31/2889* (2013.01); *G01R 31/3171* (2013.01); *G01R 31/31715* (2013.01); *G01R 31/31816* (2013.01); *G06F 9/30196* (2013.01)

(58) Field of Classification Search
CPC .......... G01R 31/31926; G01R 31/3171; G01R 31/31715; G01R 31/31816; G01R 31/2889; G01R 31/2808; G01R 1/06794; G06F 9/30196

USPC .......... 714/740, 704, 724, 742, 745; 324/754.01, 754.1, 754.11, 690, 696
See application file for complete search history.

(56) References Cited

U.S. PATENT DOCUMENTS

| | | | |
|---|---|---|---|
| 8,736,292 B2* | 5/2014 | Ishigaki | G01R 1/07385 324/754.01 |
| 2007/0273396 A1* | 11/2007 | Matsumoto | G01R 31/31851 324/724 |
| 2013/0154679 A1* | 6/2013 | Chen | G09G 3/006 324/754.1 |

(Continued)

OTHER PUBLICATIONS

Ono et al., Pin Open Detection of BGA IC by Supply Current Testing, 2014, IEEE, ICEP 2014 Proceedings, pp. 231-234. (Year: 2014).*

*Primary Examiner* — John J Tabone, Jr.
(74) *Attorney, Agent, or Firm* — Dorsey & Whitney LLP (57) ABSTRACT

An example apparatus includes an input buffer coupled to an input terminal, wherein the input buffer is configured to provide an input signal based on a voltage received at the input terminal, a test terminal configured to receive a probe signal, and a power supply terminal configured to receive an external supply voltage. The example apparatus further includes a test logic circuit configured to, in response to the probe signal indicating a test and an external supply voltage detection signal having a value indicating detection of the external supply voltage, initiate a probe contact detection test. During the initiate a probe contact detection test, the test logic circuit is configured to receive the input signal and to provide an output signal having a value based on the input signal.

21 Claims, 5 Drawing Sheets

(56) References Cited

U.S. PATENT DOCUMENTS

| | | | |
|---|---|---|---|
| 2015/0168528 A1* | 6/2015 | Kang | G01R 31/2889 |
| | | | 324/537 |
| 2016/0103172 A1* | 4/2016 | Yamashita | G01R 31/50 |
| | | | 324/754.07 |
| 2019/0094301 A1* | 3/2019 | Srinivasan | H01L 22/14 |
| 2020/0064372 A1* | 2/2020 | Arlinsky | B25J 19/023 |

\* cited by examiner

METHODS AND APPARATUSES TO DETECT TEST PROBE CONTACT AT EXTERNAL TERMINALS

BACKGROUND

During production, multiple semiconductor devices (e.g., devices or units under test (DUTs)) may be connected to a test setup in parallel to receive common input signals from a tester for highly parallel testing. The test setup may involve positioning a respective set probe needles to electrically contact respective terminals or pins of each DUT. Due to the size of terminals or pins of the semiconductor devices, one or more of the probe needles may be misaligned with a target terminal or pin such that there is an open circuit between the probe needle and the target terminal or pin. Thus, when a particular DUT with a misaligned probe needle is tested, the defective test setup may cause the tester to unnecessarily fail the DUT. Unnecessarily failing a DUT may reduce yield and production efficiency, as well as increase production costs.

DETAILED DESCRIPTION OF THE EMBODIMENTS

Examples described herein include performing probe contact detection tests on semiconductor devices being tested in highly parallel configurations. During production, many semiconductor devices (e.g., devices or units under test (DUTs)) may be connected to a test setup to receive common input signals from a tester in order to be tested in parallel with one another. The test setup may be dependent on probe needles maintaining sufficient electrical contact with terminals or pins of each DUT. Thus, the DUTs may include test logic circuitry that is configured to perform a probe contact detection test to verify that each terminal or pin is in electrical contact with a respective probe needle from a tester. The probe contact detection test may avoid unnecessarily failing a DUT due to a defective test setup. The test logic circuitry may be configured to facilitate the probe contact detection test based on values of a probe signal and an external supply voltage. As part of the probe contact detection test, the test logic may configure input buffers coupled to respective input terminals for single-ended operation. The test logic may also couple outputs of the input buffers to a logic gate. The logic gate may perform a logical operation on the outputs of the input buffers to drive an output signal. The value of the output signal may indicate whether a voltage has been received at one or more of the input terminals coupled to the input buffers. The output signal may be provided to the tester to provide an indication as to whether any open circuit exists between a probe needle and an input terminal.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
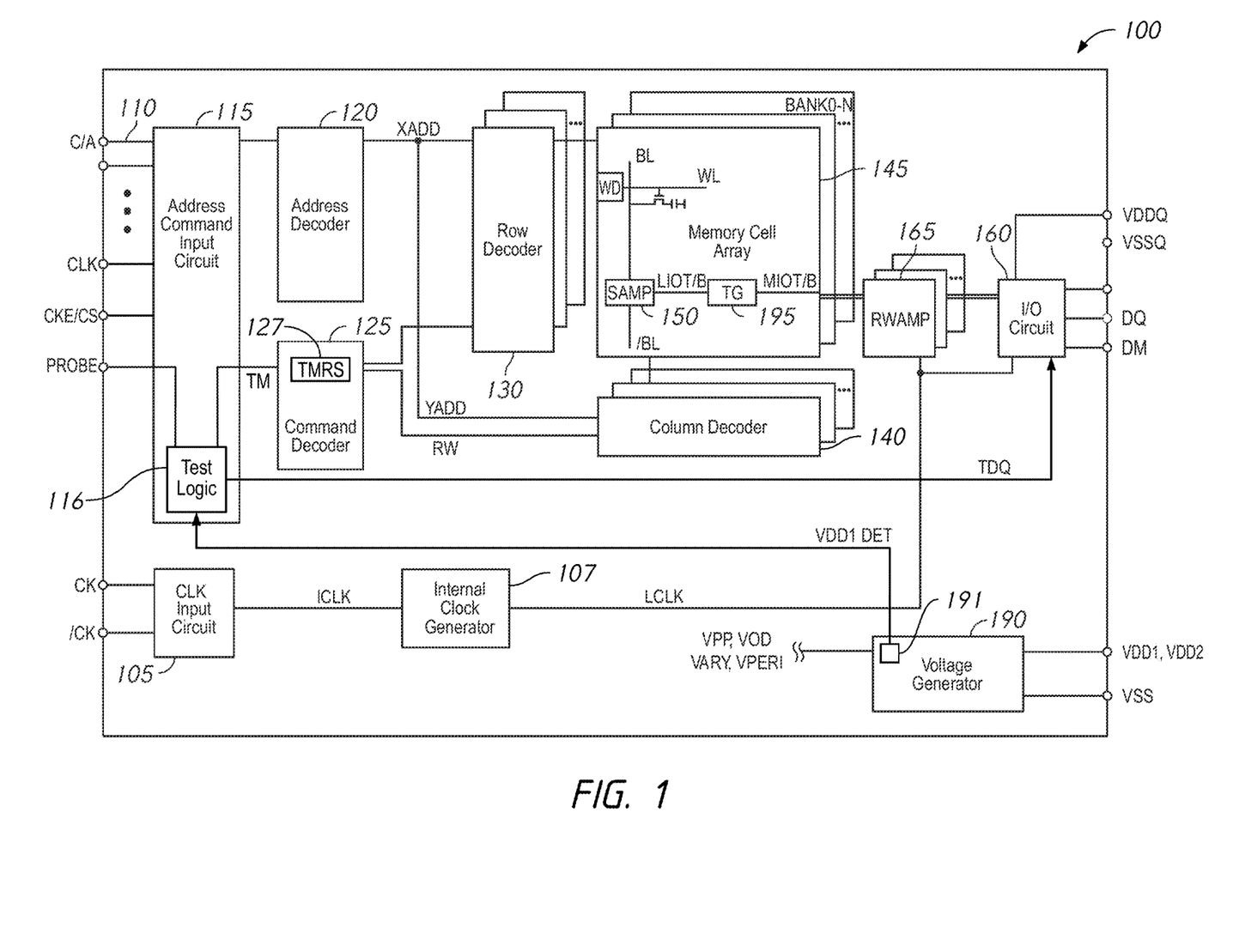
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. For example, the semiconductor device 100 a clock input circuit 105, an internal clock generator 107, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 160, and a voltage generator 190. The semiconductor device 100 may include a plurality of external terminals including address and command terminals coupled to command/address bus 110 (e.g., command/address terminals C/A, clock terminals CLK, clock enable and/or chip select terminals CKE/CS, test probe terminals PROBE, etc.); clock terminals CK and /CK; data terminals DQ, DQS, and DM; and power supply terminals VDD, VSS, VDDQ, and VSSQ;

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local 110 line further coupled to a respective one of at least two main 110 line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal to the row decoder 130 and the column decoder 140, in some examples.

The address/command input circuit 115 may receive a command signal from outside, such as, for example, a clock input circuit 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, enable signals, such as the CKE or CS signals. Signals provided on the command/address bus 110 may be clocked via the CLK signal.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 160. The IO circuit 160 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 160 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and/CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 160 and the read/write amplifiers 165. The IO circuit 160 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 160 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 160.

During production, the semiconductor device 100 may be tested contemporaneously (e.g., in parallel with) with many other semiconductor devices (e.g., devices or units under test (DUTs)). During parallel testing, a tester (not shown) may drive signals to terminals connected to the input/output bus 110 on each DUT. In response to the signals received at the input/output bus 110, each DUT may provide output data to the tester, such as via dedicated test outputs or via the DQ terminals driven by the input/output circuit 160. The tester may evaluate the output data from each DUT, and may fail a particular DUT in response to the output data from the particular DUT being different than expected output data.

Figure 4:
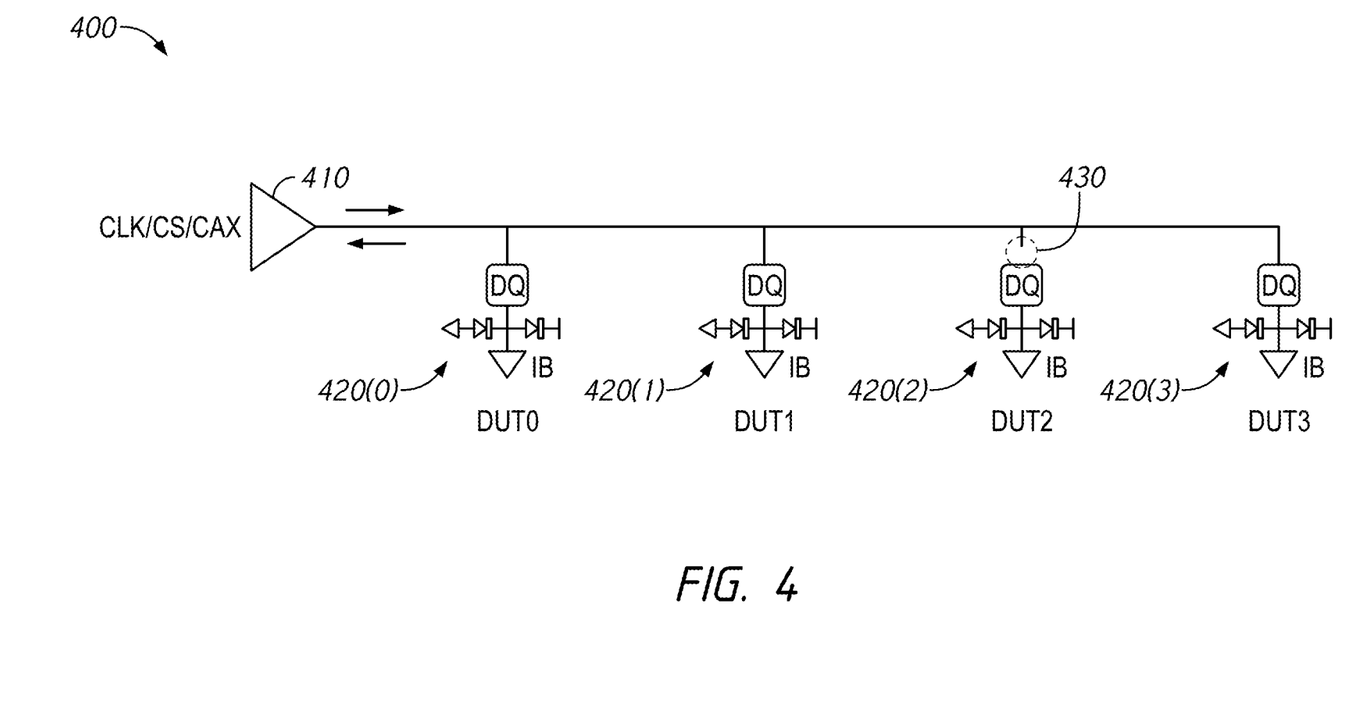
FIG. 4 depicts a functional block diagram of a parallel test setup system of multiple devices under test, in accordance with an embodiment of the disclosure.

The physical test setup for parallel testing of the semiconductor device 100 with other DUTs may include positioning probe needles of a test setup in physical contact with contacts or pins of the semiconductor device 100 that correspond to the input/output bus 110. FIG. 4 depicts a functional block diagram of a parallel test setup system 400 of multiple devices under test, in accordance with an embodiment of the disclosure. As shown the system 400, a tester driver 410 may provide common clock, chip select, or command and address bit X test data CLK/CS/CAX on a signal line coupled to a respective input buffer of each of the DUT0-3 420(0)-(3). However, errors during test setup may result in a probe needle being inadvertently positioned such that it does not maintain electrical contact with a target contact or pin of one of the DUT0-3 420(0)-(3). As shown in FIG. 4, the respective probe needle is in electrical contact with (e.g., shorted to) the respective target contact or pins of the DUT0 420(0), the DUT1 420(1), and the DUT3 420(3) However, a gap (e.g., open circuit) 430 exists between the respective probe needle and the target contact or pin of the DUT2 420(2). Even if the DUT2 420(2) has no defects that should cause the DUT2 420(2) to fail, the DUT2 420(2) may end up failing a test because the gap 430 is preventing the corresponding input buffer from receiving data from the tester driver 410.

Turning back to FIG. 1, the semiconductor device 100 may include circuitry to facilitate test operations of the semiconductor device 100 to detect test probe contact defects in a test setup. For example, the address command input circuit 115 may include a test logic circuit 116, the command decoder 125 may include a test mode TM stored as a test mode register setting (TMRS) 127 (e.g., received via the input/output bus 110), and the voltage generator circuit 190 may include a voltage detection circuit 191 configured to provide a VDD1 detection signal VDD1 DET based on a comparison between the VDD1 and the VDD2 signals. The test logic circuit 116 may receive the PROBE signal, the TM signal from the TMRS 127, and the VDD1 DET signal from the voltage detection circuit 191. The PROBE signal may indicate that the semiconductor device 100 is under test, and the TM signal may indicate a test mode configuration for the semiconductor device. The voltage detection circuit 191 may provide the VDD1 DET signal based on a comparison of the VDD1 and VDD2 voltages received at the VDD1 and VDD2 power supply terminals. The test logic circuit 116 may enter a probe contact detection mode based on values of the PROBE signal and the VDD1 DET signal from the voltage detection circuit 191. In response to entering the probe contact detection mode, the test logic circuit 116 may configure input buffers of the address command input circuit 115 to detect data received at the C/A, CLK, and/or CKE/CS terminals via the input/output bus 110 based on a particular detection mode (e.g., a single-ended detection mode). The test logic circuit 116 may also include logic circuitry that is configured to provide a test data signal TDQ having a value based on outputs of the input buffers of the coupled to the C/A, CLK, and/or CKE/CS terminals via the input/output bus 110. The input/ output circuit 160 may provide the TDQ signal at an output via one of the data terminals DQ or a test data terminal (not shown).

During a probe contact detection test, a tester may selectively drive voltages to the C/A, CLK, and/or CKE/CS terminals of the semiconductor device 100. In response, the input/output bus 110 may provide respective voltages received at the C/A, CLK, and/or CKE/CS terminals to respective input buffers of the address command input circuit 115. The logic circuitry of the test logic circuit 116 may provide the TDQ signal having a value based on the outputs of the input buffers of the address command input circuit 115 coupled to the C/A, CLK, and/or CKE/CS terminals. The input/output circuit 160 may provide the value of the TDQ signal to one of the DQ data terminals or to a special TDQ terminal (not shown).

In some examples, the tester may sequentially drive a voltage to a single one of the C/A, CLK, and/or CKE/CS terminals of the semiconductor device 100, and the test logic circuit 116 may provide the TDQ signal having a value based on whether the voltage is detected at the single one of the C/A, CLK, CKE/CS terminals. In some examples, the logic circuitry of the test logic circuit 116 may include a switching circuit that couples the outputs of the input buffers to a logic gate, and the logic gate provides the TDQ signal having a value based on an output of the logic gate. In some examples, the logic gate includes a logic OR gate. The test logic circuit 116 configured to enable the probe contact detection test may reduce detection of false-positive errors in the semiconductor device 100 due to test setup defects, which may reduce time and cost to perform an additional evaluation of the semiconductor device 100, and/or may reduce cost associated with discarding the semiconductor device 100

Figure 2:
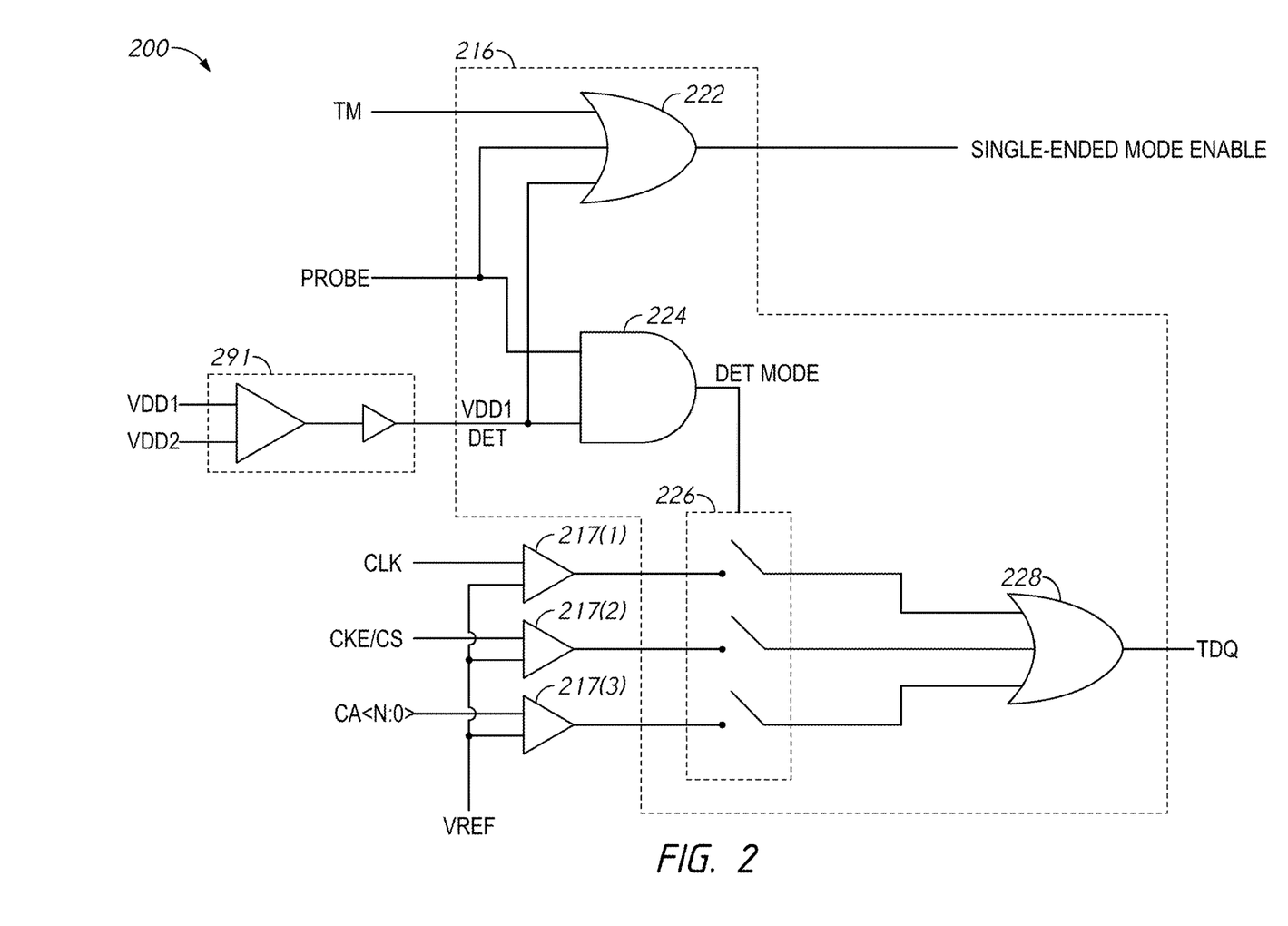
FIG. 2 is a logic diagram of a test circuitry of a semiconductor device, in accordance with an embodiment of the present disclosure.

FIG. 2 is a logic diagram of a test circuitry of a semiconductor device 200, in accordance with an embodiment of the present disclosure. The test circuitry of the semiconductor device 200 may include a test logic circuit 216, input buffers 217(1)-(3), and a voltage detection circuit 291. The semiconductor device 100 of FIG. 1 may implement the test circuitry of the semiconductor device 200.

The input buffers 217(1)-(3) may be configured to receive a clock CLK signal, a clock enable/chip select signal CKE/CS, or command/address signals CA<N:0>, respectively, and may be configured to provide an output signal based on a respective value (e.g., voltage) of the CLK signal, the CKE/CS signal, or the CA<N:0> signals, respectively. In some examples, the input buffers 217(1)-(3) may be configured to single-ended operation. That is, the input buffers 217(1)-(3) may provide the respective output signal having a high logical value (e.g., first logical value) when the respective value (e.g., voltage) of the CLK signal, the CKF/CS signal, or the CA<N:0> signals, respectively, exceeds a threshold voltage, and may provide the respective output signal having a low logical value (e.g., second logical value) when the respective value (e.g., voltage) of the CLK signal, the CKE/CS signal, or the CA<N:0> signals, respectively, is less than a threshold voltage. The input buffers 217(1)-(3) may be included in an address command input circuit, such as the address command input circuit 115 of FIG. 1, in some examples. For clarity, FIG. 2 is depicted with a single input buffer 217(3) to receive each of the CA<N:0> signals. However, the 217(3) may include N+1 individual input buffers each configured to receive a respective one of the CA<N:0> signals without departing from the scope of the disclosure.

The voltage detection circuit 291 may include a differential amplifier coupled to a driver circuit. The differential amplifier may be configured to receive the VDD1 voltage at a first input and the VDD2 voltage at a second input. The VDD1 and VDD2 voltages may be externally-provided voltages received at a power supply terminal of the semiconductor device 200. The differential amplifier may be configured to provide an output signal to the driver having a value based on a voltage differential between the VDD1 and VDD2 voltages. The driver may provide a VDD1 detection signal VDD1 DET based on the output of the differential amplifier.

The test logic circuit 216 may include an OR gate 222, an AND gate 224, switching circuitry 226, and an OR gate 228. The OR gate 222 may be configured to receive a test mode signal TM having a value based on a test mode register setting, a probe signal PROBE, and the VDD1 DET signal from the voltage detection circuit 291. The OR gate 222 may provide a single-ended detection mode enable signal having a value based on the TMRS, the PROBE signal, and the VDD1 DET signal using OR logic. The single-ended detection mode enable signal may configure the input buffers 217(1)-(3) to detect signals using a single-ended detection mode to detect an input signal. In some examples, a probe contact detection test may be performed when the input buffers 217(1)-(3) are in a differential mode, in some examples.

The AND gate 224 may be configured to receive the PROBE signal and the VDD1 DET signal from the voltage detection circuit 291. The AND gate 224 may provide a probe contact detection test mode signal DETMODE having a value based on the PROBE signal and the VDD1 DET signal using AND logic. The switching circuitry 226 may include individual switching circuits configured to couple the outputs of each of the input buffers 217(1)-(3) to the OR gate 228 in response to the DETMODE signal. The switching circuits may include any type of switching circuit that is capable of selectively coupling the input buffers 217(1)-(3) to the OR gate 228 based on a value of the DETMODE signal. The OR gate 228 may provide the outputs of the input buffers 217(1)-(3) received via the switching circuitry 226, and may provide a test data output signal TDQ using OR logic.

In operation, the test circuitry of the semiconductor device 200 may configure the semiconductor device 200 to perform a probe contact detection test based on the PROBE signal, and the VDD1 and VDD2 voltages. For examples, in response to the PROBE signal being set to a high logical value (e.g., a first logical value), such as by a tester (not shown), the OR gate 222 may provide the single-ended detection mode enable signal having a value that enabled single-ended voltage detection at the input buffers 217(1)-(3).

The voltage detection circuit 291 may compare voltage magnitudes of the VDD1 voltage and the VDD2 voltages to provide the VDD1 DET signal. The VDD1 detection signal may be set to a logical high value (e.g., the first logical value) in response to detection that the VDD1 voltage exceeds the VDD2 voltage by a threshold value. The threshold value may be between 0.5 volts and 2 volts, in some examples. The threshold value may be between 1 volt and 2 volts, in some examples.

In response to the VDD1 DET signal and the PROBE signal each having the high logical values, the AND gate 224 may provide the DETMODE signal having the high logical value using AND logic. In response to the DETMODE signal having the high logical value, the switching circuitry 226 may couple the outputs of the outputs of each of the input buffers 217(1)-(3) to the OR gate 228.

During the probe contact detection test, in response to receipt of a high logical value (e.g., a first logical value) voltage at a respective terminal (e.g., CLK, CKE/CS, CA<N:0>) coupled to one of the input buffers 217(1)-(3), the respective input buffer 217(1)-(3) may provide the high logical value to the OR gate 228 via the switching circuitry 226. Using OR logic, when the output of any of the input buffers 217(1)-(3) is set to the high logical value, the OR gate 228 may provide the TDQ signal having the high logical value. Otherwise, when the outputs of all of the input buffers 217(1)-(3) have a low logical value (e.g., second logical value), the OR gate 228 may provide the TDQ signal having the low logical value. The TDQ signal may be provided at an output terminal of the semiconductor device 200. In some examples a tester may read the TDQ signal value to detect a probe contact defect. In some examples, a tester may sequentially cycle through provision of the high logical value voltage to one respective terminal (e.g., CLK, CKE/CS, CA<N:0>) at a time, and may check the value provided on the TDQ signal to determine whether the one respective terminal properly received the high logical value.

In some examples, the OR gate 228 of FIG. 2 may represent any arrangement of logic circuitry that is configured to provide a value on the TDQ signal that is equivalent to applying a collective OR logic operation on the outputs of the input buffers 217(1)-(3). For example, the OR gate 228 may include XOR logic gates that are each configured to perform an XOR logic operation on a respective pair the outputs of the input buffers 217(1)-(3), and an OR logic gate configured to receive the outputs of each of the XOR gates and to perform an OR logic operation on the outputs of the XOR gates to provide the value to the TDQ signal.

In some examples, while the test logic circuit 216 of FIG. 2 includes the OR gate 228 (e.g., or equivalent) to provide the TDQ signal using OR logic, other logic gates may be used to implement the probe contact detection test. For example, the OR gate 228 may, additionally or alternatively, include an AND logic gate (e.g., or equivalent), and the tester may contemporaneously provide the high logical value voltage to each respective terminal (e.g., CLK, CKE/CS, CA<N:0>), and the value of the TDQ signal may reflect whether any of the respective terminals failed to receive the high logical value voltage.

In another example, the outputs of the switching circuitry 226 may be provided directly to an output as multiple TDQ signals. In this example, the tester may contemporaneously provide the high logical value voltage to each respective terminal (e.g., CLK, CKF/CS, CA<N:0>), and the values of the TDQ signals may reflect whether a respective terminal failed to receive the high logical value voltage.

The test logic circuit 216 configured to enable the probe contact detection test may reduce detection of false-positive errors in the semiconductor device 200 due to test setup defects, which may reduce time and cost to perform an additional evaluation of the semiconductor device 200, and/or may reduce cost associated with discarding the semiconductor device 200.

Figure 3:
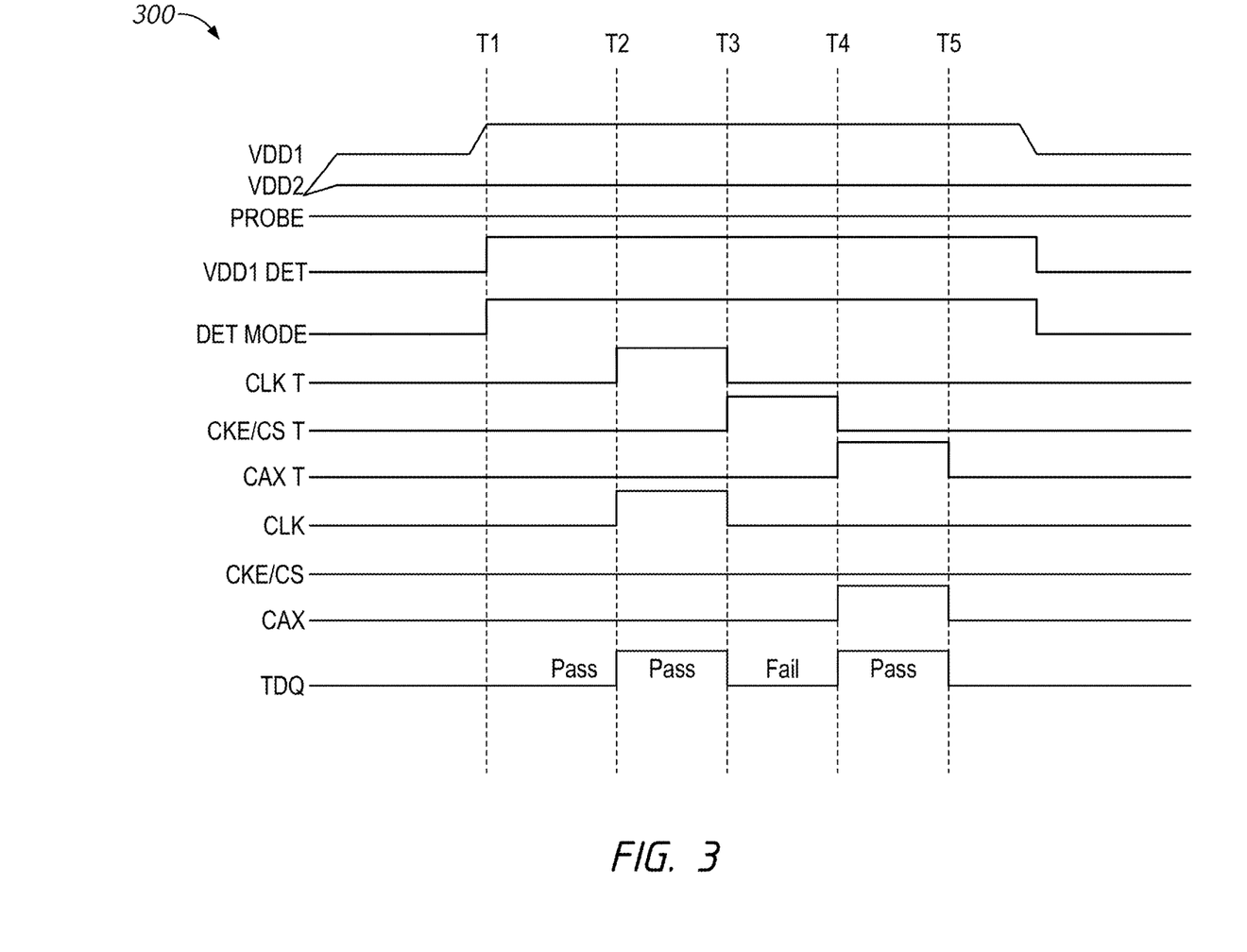
FIG. 3 is an illustration of an exemplary timing diagram depicting operation of a probe contact detection test, in accordance with embodiments of the disclosure.

FIG. 3 is an illustration of an exemplary timing diagram 300 depicting operation of a probe contact detection test, in accordance with embodiments of the disclosure. In some examples, the timing diagram 300 may depict operation of the test logic circuit 116 and/or the voltage detection circuit 191 of FIG. 1, the test logic circuit 216 and the voltage detection circuit 291 of FIG. 2, or combinations thereof. The VDD1, VDD2, PROBE, VDD1 DET, CLK, CKE/CS, CAX, and TDQ signals may correspond to the VDD1, VDD2, PROBE, VDD1 DET, CLK, CKE/CS, one of the C/A or CA<N:0>, and TDQ signals of FIGS. 1 and 2. The DET MODE signal may correspond to the DET MODE signal of FIG. 2. The CLK T, CKE/CS T, CAX T signals may correspond to signals provided to the CLK, CKE/CS, CAX terminals from a tester.

Prior to time T1, the PROBE signal may be set to a high logical value (e.g., first logical value) and the VDD1 and VDD2 voltages may be ramped up to respective voltages. At time T1, in response to the voltage differential between VDD1 and VDD2 exceeding a threshold, the VDD1 DET signal may transition to a high logical value. Transition of the VDD1 DET signal may be performed by a VDD1 voltage detection circuit, such as the voltage detection circuit 191 of FIG. 1 and/or the voltage detection circuit 291 of FIG. 2.

In response to transition of the VDD1 DET signal to the high logical value and the PROBE signal having the high logical value, the DET MODE signal may transition to the high logical value. Transition of the DET MODE signal may be performed using a logic gate, such as the AND gate 224 of FIG. 2, based on the VDD1 DET and PROBE signals. In response to the DET MODE signal being set to the high logical value, the CLK, CKE/CS, CAX terminal signals may be coupled to a logic gates (e.g., the OR gate 228 of FIG. 2) via input buffers (e.g., the 217(1)-(3) of FIG. 2) and/or a switching circuit (e.g., the switching circuitry 226 of FIG. 2). The logic gate may be configured to provide the TDQ signal.

Between times T1 and T2, the CLK T, CKE/CS T, CAX T signals may be held at low logical values (e.g., second logical values). In response, all of the CLK, CKE/CS, CAX terminals remain at the low logical value, and the TDQ signal is maintained at the low logical value based on all of the CLK, CKE/CS, CAX signals remaining at the low logical value.

At time T2, the tester may transition the CLK T signal to the high logical value. In response, the CLK signals may transition to the high logical value. In response to the CLK signal transitioning to the high logical value, the TDQ signal may transition to the high logical value. Because the TDQ signal transitions to the high logical value when the CLK T signal is set to the high logical value, the probe contact test of the CLK terminal may "Pass."

At time T3, the tester may transition the CLK T signal to the low logical value and CKE/CS T signal to the high logical value. However, the CKE/CS signal may remain at the low logical value. In response to the CKE/CS signal remaining at the low logical value, the TDQ signal may transition to the low logical value. Because the TDQ signal transitions to the low logical value when the CKE/CS T signal is set to the high logical value, the probe contact test of the CKE/CS terminal may "Fail."

At time T4, the tester may transition the CKE/CS T signal to the low logical value and CAX T signal to the high logical value. The "X" may indicate any single bit of command and address signals received at command and address terminals of a semiconductor device. In response, the CAX signals may transition to the high logical value. In response to the CAX signal transitioning to the high logical value, the TDQ signal may transition to the high logical value. Because the TDQ signal transitions to the high logical value when the CAX T signal is set to the high logical value, the probe contact test of the CAX terminal may "Pass.". At time T5, the tester may transition the CAX signal to a low logical value. The probe contact detection test may continue after time T5 with other bits of the command and address bus that correspond to other command and address terminals of the semiconductor device. If every terminal tested passes the probe contact detection test, then the test setup may be successfully positioned to perform additional testing of the semiconductor device.

The timing diagram 300 is exemplary for illustrating operation of various described embodiments. Although the timing diagram 300 depicts a particular arrangement of signal transitions of the included signals, one of skill in the art will appreciate that additional or different transitions may be included in different scenarios without departing from the scope of the disclosure, including addition of delays between serially-related signals. Further, the depiction of a magnitude of the signals represented in the timing diagram 300 is not intended to be to scale, and the representative timing is an illustrative example of a timing characteristics.

Figure 5:
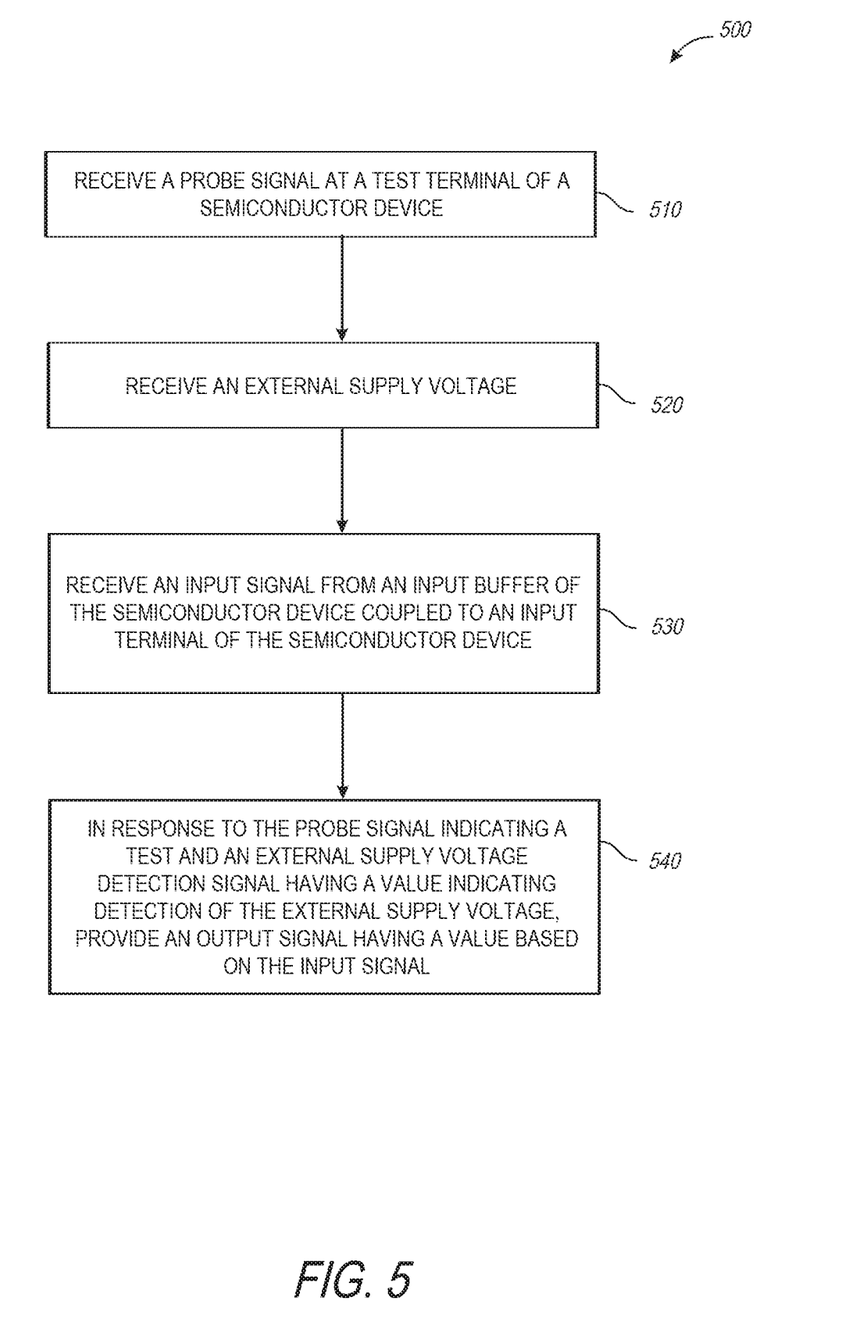
FIG. 5 is a flow diagram illustrating a method to perform a probe contact detection test, in accordance with an embodiment of the present disclosure.

FIG. 5 is a flow diagram illustrating a method 500 to perform a probe contact detection test, in accordance with an embodiment of the present disclosure. The method 500 may be performed using part or all of the semiconductor device 100 of FIG. 1 and/or the test circuitry of the semiconductor device 200 of FIG. 2.

The method 500 may include receiving a probe signal at a test terminal of a semiconductor device, at 510. The probe signal may include the PROBE signals of FIGS. 1-3. The test terminal may include the input terminal of the semiconductor device 100 of FIG. 1 configured to receive the PROBE signal. The method 500 may further include receiving an external supply voltage, at 520. The external supply voltage may include the VDD1 voltage of FIGS. 1 and 2. The external supply voltage may be received at a power supply terminal, such as the power supply terminal of the semiconductor device 100 of FIG. 1 configured to receive the VDD1 voltage.

The method 500 may further include receiving an input signal from an input buffer of the semiconductor device coupled to an input terminal of the semiconductor device, at 530. The input signal may be based on a voltage received at the input terminal. In some examples, the method 500 may further include receiving one of a clock signal, a clock enable signal, a chip select signal, or a command and address bit signal at the input terminal. The input buffer may include an input buffer of the address command input circuit 115 of FIG. 1 and/or one of the input buffers 217(1)-(3) of FIG. 2. The input terminal may include one of the C/A, CLK, or CKE/CS input terminals of the semiconductor device 100 of FIG. 1. The input signal may include one of the CLK, CKE/CS, or CA<N:0> signals of FIGS. 2 and 3. In some examples, the method 500 may include, in response to the probe signal indicating the test, configuring the input buffer for single-ended operation (e.g., the single-ended detection mode enable signal of FIG. 2 is set). In some examples, the probe signal may be provided to a logic gate, such as the OR gate 222 of FIG. 2, and an output of the logic gate may be configured to cause the input buffer to be configured for single-ended operation.

The method 500 may further include, in response to the probe signal indicating a test and an external supply voltage detection signal having a value indicating detection of the external supply voltage, providing an output signal having a value based on the input signal, at 540. The output signal may include the TDQ signal of FIGS. 1-3. In some examples, the probe signal and the external supply voltage detection signal may be compared at a logic gate, such as the AND gate 224 of FIG. 2. In some examples, the method 500 may further include providing the output signal having a first logical value in response to the voltage received at the input terminal exceeding a threshold voltage, and providing the output signal having a second logical value in response to the voltage received at the input terminal being less than the threshold voltage. The external supply voltage detection signal may include the VDD1 DET signal of FIGS. 1-3. In some examples, the method 500 may further include providing the external supply voltage detection signal having the value indicating detection of the external supply voltage in response to the external supply voltage being greater than a second external supply voltage by at least a threshold voltage. In some examples, the external supply voltage detection signal may be provided by the voltage detection circuit 191 of FIG. 1 and/or the voltage detection circuit 291 of FIG. 2.

In some examples, the method 500 may further include, in response to the probe signal indicating the test and the external supply voltage detection signal having the value indicating detection of the external supply voltage, causing a switch circuit to couple a respective input signal from each of a plurality of input buffers of the semiconductor device, including the input signal of the input buffer, to a logic gate, and performing, via the logic gate, a logical operation based on the respective input signals from each of the plurality of input buffers to provide the output signal. Each of the plurality of input buffers may be coupled to a different respective input terminal of the semiconductor device. The switch circuit may include a switch circuit of the test logic circuit 116 of FIG. 1 and/or the switching circuitry 226 of FIG. 2. The plurality of input buffers may include an input buffer of the address command input circuit 115 of FIG. 1 and/or one of the input buffers 217(1)-(3) of FIG. 2. The different respective input terminals may include the C/A, CLK, and/or CKE/CS input terminals of the semiconductor device 100 of FIG. 1. The respective input signals may include the CLK, CKE/CS, and/or CA<N:0> signals of FIGS. 2 and 3. In some examples, the logical operation may include a logical OR operation. The logic gate may include a logic gate of the test logic circuit 116 of FIG. 1 and/or the OR gate 228 of FIG. 2.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:
1. An apparatus comprising:
an input buffer coupled to an input terminal, wherein the input buffer is configured to provide an input signal based on a voltage received at the input terminal;
a test terminal configured to receive a probe signal;
a power supply terminal configured to receive an external supply voltage; and a test logic circuit configured to, in response to the probe signal indicating a test and an external supply voltage detection signal having a value indicating detection of the external supply voltage, initiate a probe contact detection test, wherein, during the initiate a probe contact detection test, the test logic circuit is configured to receive the input signal and to provide an output signal having a value based on the input signal.

2. The apparatus of claim 1, wherein, during the probe contact detection test, the test logic circuit is configured to provide the output signal having a first logical value in response to the voltage received at the input terminal exceeding a threshold voltage and to provide the output signal having a second logical value in response to the voltage received at the input terminal being less than the threshold voltage.

3. The apparatus of claim 1, further comprising a second input buffer coupled to a second input terminal, wherein the second input buffer is configured to provide a second input signal based on a voltage received at the second input terminal, wherein, during the probe contact detection test, the test logic circuit is configured to provide the output signal having a value further based on the second input signal.

4. The apparatus of claim 3, wherein, during the probe contact detection test, the test logic circuit is configured to provide the output signal having a first logical value in response to the voltage received at either of the input terminal or the second input terminal exceeding a threshold voltage and to provide the output signal having a second logical value in response to the voltage received at both of the input terminal and the second input terminal being less than the threshold voltage.

5. The apparatus of claim 1, further comprising an external supply voltage detection circuit configured to provide the external supply voltage detection signal having the value indicating detection of the external supply voltage in response to the external supply voltage being greater than a second external supply voltage by at least a threshold voltage.

6. The apparatus of claim 1, wherein the test logic circuit is configured to, in response to the probe signal indicating the test, configuring the input buffer for single-ended operation.

7. The apparatus of claim 1, wherein the test logic circuit is configured to, in response to the probe signal indicating the test and the external supply voltage detection signal having the value indicating detection of the external supply voltage, causing a switch circuit to couple an output of the input buffer to the test logic circuit.

8. The apparatus of claim 7, wherein the test logic circuit is configured to, in response to the probe signal indicating the test and the external supply voltage detection signal having the value indicating detection of the external supply voltage, causing the switch circuit to couple the output of the input buffer to a logic gate configured to provide the output signal.

9. The apparatus of claim 8, wherein the test logic circuit is configured to, in response to the probe signal indicating the test and the external supply voltage detection signal having the value indicating detection of the external supply voltage, causing the switch circuit to couple outputs of a plurality of input buffers, including the input buffer, to the logic gate, wherein each of the plurality of input buffers is coupled to a different respective input terminal.

10. The apparatus of claim 9, wherein the logic gate is configured to perform a logical OR operation on the outputs of the plurality of input buffers to provide the output signal.

11. The apparatus of claim 9, wherein the logic gate is configured to perform a logical AND operation on the outputs of the plurality of input buffers to provide the output signal.

12. The apparatus of claim 1, wherein the input terminal is configured to receive one of a clock signal, a clock enable signal, a chip select signal, or a command and address bit signal.

13. A method comprising:
receiving a probe signal at a test terminal of a semiconductor device;
receiving an external supply voltage;
receiving an input signal from an input buffer of the semiconductor device coupled to an input terminal of the semiconductor device, wherein the input signal based on a voltage received at the input terminal; and
in response to the probe signal indicating a test and an external supply voltage detection signal having a value indicating detection of the external supply voltage, providing an output signal having a value based on the input signal.

14. The method of claim 13, further comprising:
providing the output signal having a first logical value in response to the voltage received at the input terminal exceeding a threshold voltage; and
providing the output signal having a second logical value in response to the voltage received at the input terminal being less than the threshold voltage.

15. The method of claim 13, further comprising:
receiving a second input signal from a second input buffer of the semiconductor device coupled to a second input terminal of the semiconductor device, wherein the second input signal based on a voltage received at the second input terminal; and
in response to the probe signal indicating the test and the external supply voltage detection signal having the value indicating detection of the external supply voltage, providing the output signal having the value further based on the second input signal.

16. The method of claim 15, further comprising, in response to the probe signal indicating the test and the external supply voltage detection signal having the value indicating detection of the external supply voltage:
providing the output signal having a first logical value in response to the voltage received at either of the input terminal or the second input terminal exceeding a threshold voltage; and
providing the output signal having a second logical value in response to the voltage received at both of the input terminal and the second input terminal being less than the threshold voltage.

17. The method of claim 13, further comprising providing the external supply voltage detection signal having the value indicating detection of the external supply voltage in response to the external supply voltage being greater than a second external supply voltage by at least a threshold voltage.

18. The method of claim 13, further comprising, in response to the probe signal indicating the test, configuring the input buffer for single-ended operation.

19. The method of claim 13, further comprising, in response to the probe signal indicating the test and the external supply voltage detection signal having the value indicating detection of the external supply voltage:

causing a switch circuit to couple a respective input signal from each of a plurality of input buffers of the semiconductor device, including the input signal of the input buffer, to a logic gate, wherein each of the plurality of input buffers is coupled to a different respective input terminal of the semiconductor device; and performing, via the logic gate, a logical operation based on the respective input signals from each of the plurality of input buffers to provide the output signal.

20. The method of claim 19, wherein the logical operation includes a logical OR operation.

21. The method of claim 13, further comprising receiving one of a clock signal, a clock enable signal, a chip select signal, or a command and address bit signal at the input terminal.

* * * * *